United States Patent [19]

de Kleijn

[11] Patent Number: 4,481,462
[45] Date of Patent: Nov. 6, 1984

[54] AMPLITUDE CONTROL SYSTEM

[75] Inventor: Albertus J. de Kleijn, Hilversum, Netherlands

[73] Assignee: U.S. Philips Corporation, New York, N.Y.

[21] Appl. No.: 444,274

[22] Filed: Nov. 24, 1982

[30] Foreign Application Priority Data

Dec. 17, 1981 [NL] Netherlands ............... 8105688

[51] Int. Cl.³ .................. G05F 1/48; H03K 5/01
[52] U.S. Cl. ........................... 323/274; 323/280; 323/226; 330/293; 330/297
[58] Field of Search ........ 323/226, 222, 224, 273–275, 323/280, 281; 330/293, 294, 296, 297

[56] References Cited

U.S. PATENT DOCUMENTS

| | | | |
|---|---|---|---|
| 3,463,928 | 8/1969 | Murphy | 330/294 X |
| 3,916,294 | 10/1975 | Kennedy | 323/275 |
| 4,035,738 | 7/1977 | Anzalone | 330/293 |
| 4,053,847 | 10/1977 | Kumahara et al. | 330/297 X |
| 4,334,185 | 6/1982 | Turney et al. | 323/280 |

Primary Examiner—Peter S. Wong
Attorney, Agent, or Firm—Robert T. Mayer; Bernard Franzblau

[57] ABSTRACT

An amplitude control system comprising, arranged between the input (1) and the output (2) of the system, a series arrangement of a resistor (3) and an amplifier (5). The input of the amplifier (5) is connected to a point of constant potential via the main current path of a transistor (4). The control electrode (13) of the transistor is connected to an integrator (6, 7) and is connected to the output (2) of the control system via a control loop. The control loop comprises a current source (10) which is connected to the control electrode (13) of the transistor (4) via a first switching element (8) and is also connected to a point of constant potential via a second switching element (9). The output (2) of the system is connected to one input (15) of a comparator whose other input (16) is connected to a source of reference voltage (12), the output voltage of the comparator (11) controlling the two switching elements (8, 9) such that the first switching element (8) is closed and the second switching element (9) is opened when the voltage on the one input (15) of the comparator (11) is higher than the voltage on the other input (16). The first switching element (8) is opened and the second switching element (9) is closed when the voltage on the one input (15) of the comparator (11) is lower than the voltage on the other input (16).

2 Claims, 3 Drawing Figures

AMPLITUDE CONTROL SYSTEM

The invention relates to an amplitude control system comprising, arranged between the input and the output of the system, a series arrangement of a resistor and an amplifier, the input of the amplifier being connected to a point of constant potential via the main current path of a transistor, the control electrode of the transistor being connected to an integrator and to the output of the control system via a control loop.

Such an amplitude control system is disclosed in, for example, DT-OS No. 1,512,291. The control electrode of the transistor is connected to the output of a comparator one input of which is connected to a source of reference voltage and the other input to a first switching element via a resistor and a memory device. A capacitance is provided between the other input and the output of the comparator. Together with the resistor the capacitance forms an integrator. The first switching element is connected to a point of constant potential via a second switching element which is bypassed by a capacitance. The first switching element is also connected to the output of the control system via a diode.

The capacitance connected to the second switching element and the diode together form what is commonly referred to as a peak-value detector which during the period of time in which the first switching element is closed and the second switching element is open measures the amplitude of the voltage present on the output of the control system. This amplitude information is thereafter stored in the memory device. Thereafter, the first switching element is opened and the second switching element is closed. The amplitude information contained in the memory is applied to the comparator which produces an output voltage which is applied to the control electrode of the transistor in the integrated form. Simultaneously, the capacitance of the peak-value detector is discharged by the second switching element and made ready for the reception of a next amplitude sample.

This prior art amplitude control has the disadvantage that the magnitude of the amplitude of the output signal is measured by means of a peak-value detector. This measurement, charging a capacitance, is effected by means of a diode and is rather inaccurate due to the temperature behaviour of this diode. In addition, this measuring method is very sensitive to interference. If, for example, a high-amplitude interference peak occurs on the output signal of the control system the voltage across the capacitance of the peak value detector will surge, which results in an excessive amplitude reduction by the system. This is caused by the fact that in this type of control the prevailing amplitude of the output signal is decisive for the amplitude reduction. Furthermore, the prior art amplitude control system requires many additional components, such as three monostable flip-flops for controlling the switching elements and a memory device.

A further disadvantage of the known amplitude control is that the switches used are opened and closed by means of the said flip-flops, which are in no relationship whatsoever with the signal to be sampled. It is difficult to adjust the sampling instants such that they accurately coincide with the instant at which the peaks occur in the signal to be sampled. As a result thereof the generated control voltage will depend on the instants at which the signal is sampled.

The invention has for an object to provide an amplitude control system which does not have the above-mentioned disadvantages and moreover is of a simpler construction. The invention is characterized in that the control loop comprises a current source which is connected to the control electrode of the transistor via a first switching element and is also connected to a point of constant potential via a second switching element. The output of the system is connected to one input of a comparator whose other input is connected to a source of reference voltage. The output voltage of the comparator controls the two switching elements in such a manner that the first switching element is closed and the second switching element is opened when the voltage on one input of the comparator is higher than the voltage on the other input, the first switching element being opened and the second switching element being closed when the voltage on the one input of the comparator is lower than the voltage on the other input.

The invention will now be further described by way of example with reference to the accompanying drawing in which.

Figure 1:
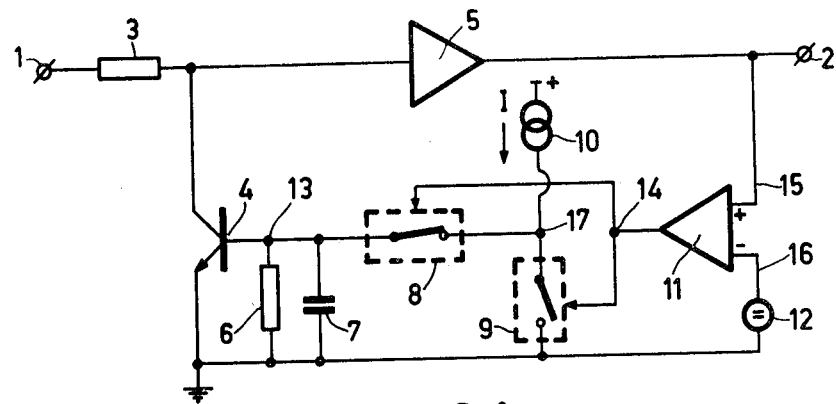
FIG. 1 shows an embodiment of the amplitude control system in accordance with the invention.
Figure 3:
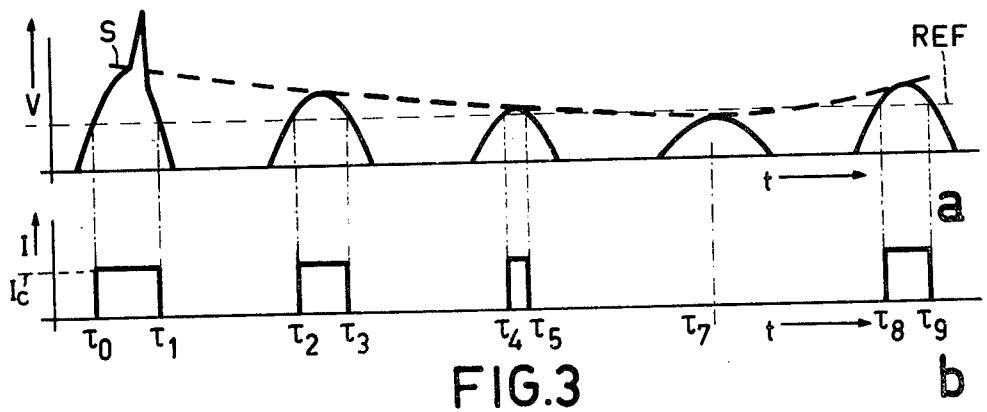
FIG. 3 shows a voltage diagram to explain the operation of the amplitude control system in accordance with the invention.

In the embodiment of FIG. 1, input 1 is connected to the output 2 of the system via the series arrangement of the resistor 3 and the amplifier 5. Via the collector-emitter path of the transistor 4 the input of the amplifier 5 is connected to a point of ground potential. The parallel arrangement of the resistor 6 and the capacitance 7 is arranged between the base and the emitter of the transistor 4. Via the first switching element 8 the base of the transistor 4 is connected to the current source 10 which itself is connected to a point of ground potential via the second switching element 9. The control inputs of the two switching elements are connected to the output of the comparator 11. The input 15 of the comparator is connected to the output 2 of the control system. The other input 16 of the comparator 11 is connected to a point of ground potential via the source of reference voltage 12. The amplitude control system operates as follows:

When the signal at the output 2 becomes higher than the reference voltage REF produced by the source 12, as is, for example, the case in the time interval $\tau_0-\tau_1$ in FIG. 3, the output voltage of the comparator 11 ensures that the first switching element 8 is closed while the second switching element 9 is opened. In response thereto the capacitance 7 will be charged in said time interval by a constant current I. Each time the threshold voltage REF is exceeded again, as in the further time intervals $(\tau_2-\tau_3)$, $(\tau_4-\tau_5)$, shown in FIG. 3 the capacitance 7 will be charged further via the current source 10. In response thereto the voltage across the capacitance 7 increases, causing the transistor 4 to become increasingly conductive. The collector current of the transistor 4 will increase according as this voltage increases. The voltage drop across the resistor 3 also increases, causing the voltage at the output 2 to decrease. This continues until the voltage at the input 15 has become substantially equal to the voltage at the input 16 of the comparator.

The period of time during which the first switching element 8 remains closed is only determined by the time the voltage at the output 2 of the control device is greater than the voltage produced by the reference source 12. Any possible voltage peak S, see FIG. 3a, does not influence the amplitude reduction by the system. This means that the control device in accordance with the invention has been made insensitive to sudden voltage peaks in the signal to be processed. When the voltage at the output 2 of the control system is lower than the voltage from the reference source 12, such as at $t=\tau_7$ in FIG. 3a, the switch 8 will be opened and the switch 9 will be closed. The current produced by the current source 10 now flows to ground via the switch 9. The capacitance 7 is slowly discharged by the resistor 6 with a time constant which is determined by the product of the resistance value of the resistor 6 and the capacitance value of the capacitance 7. As a result thereof the voltage across the capacitance will decrease, in response to which the transistor 4 will be conductive to a lesser extent. The collector current of the transistor 4 will decrease causing the voltage drop across the resistor 3 to decrease and the voltage at the output 2 of the control system to increase.

The use of the current source 10 to charge the capacitance 7 consequently prevents the capacitance 7 from being abruptly charged to its full capacitance at the occurrence of large noise peaks in the signal to be processed. In practice, the current source 10 may be in the form of a resistor since the voltage across the capacitance 7 varies little. As the average period of time in which the current source 10 charges the capacitance 7 must be constant, a pulse width modulation will be created at the occurrence of the noise signal in the control of the current source 10, as can be readily seen from FIG. 3b. The system of pulse width modulation remains operative at an increasing amplitude of the noise signal until the amplitude of the signal + interference decreases to below the voltage from the reference source 12. In that event the current source 10 is decoupled from the capacitance 7 because of the fact that switch 8 is opened. The capacitance 7 is then, as described in the foregoing, discharged via the resistor 6.

The measure in accordance with the invention further achieves that the switches 8 and 9 are now opened and closed by the output signal of the comparator 11 and not by means of a separate sampling circuit. Consequently, the synchronization between the sampling instants and the instants at which the peaks in the signal occur is no longer required.

Figure 2:
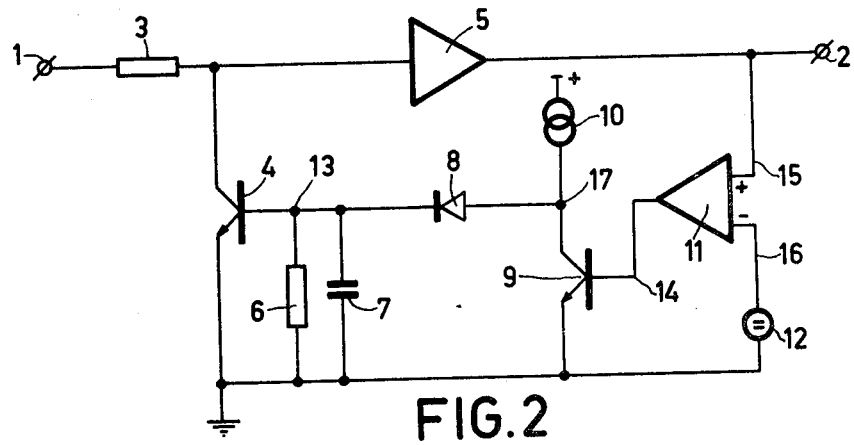
FIG. 2 shows how the two switching elements of FIG. 1 can be realized.

The embodiment of FIG. 2 further shows how the switching elements 8 and 9 can be realized in a simple manner. The first switching element is in the form of a diode and the switching element 9 is in the form of a transistor. The comparator 11 is dimensioned such that the transistor 9 does not conduct when the voltge at the input 15 of the comparator 11 exceeds the voltage at the input 16 of the comparator 11. In that case the current source 10 is connected via the diode 8 to the capacitance 7, which is charged by the current source. In the case where the voltage at the input 15 is lower than the voltage at the input 16, the transistor 9 will become conductive causing the current source 10 to be decoupled from the capacitance 7.

In the embodiment shown in FIG. 2 a diode and a bipolar transistor are provided as the switching element. It will be obvious that alternatively field effect transistors may be used as the switching elements. Likewise, the transistor 4 may be in the form of a field effect transistor.

What is claimed is:

1. An amplitude control system comprising, a series arrangement of a resistor and an amplifier connected between an input and an output of the system, means connecting an input of the amplifier to a point of constant potential via the main current path of a transistor, means connecting a control electrode of the transistor to an integrator and to the output of the control system via a control loop, wherein the control loop comprises a current source connected to the control electrode of the transistor via a first switching element and also being connected to a point of constant potential via a second switching element, means connecting the output of the system to one input of a comparator whose other input is connected to a source of reference voltage, the output voltage of the comparator controlling the first and second switching elements such that the first switching element is closed and the second switching element is opened when the voltage on the one input of the comparator is higher than the voltage on the other input, the first switching element being opened and the second switching element being closed when the voltage on the one input of the comparator is lower than the voltage of the other input.

2. An amplitude control system as claimed in claim 1, wherein the first switching element comprises a semiconductor diode and the second switching element comprises a second transistor having a control electrode connected to the output of the comparator, the collector-emitter path of said second transistor being connected between the current source and a point of constant potential.

* * * * *